United States Patent
Sridhar et al.

(10) Patent No.: US 6,353,295 B1
(45) Date of Patent: *Mar. 5, 2002

(54) LAMP ELECTRONIC BALLAST WITH A PIEZOELECTRIC COOLING FAN

(75) Inventors: Shri Sridhar, Scotch Plains, NJ (US); Vivek Mehrotra, Thousand Oaks, CA (US); Juan Sabate, Yorktown Heights; Gert W. Bruning, Tarrytown, both of NY (US); Nicolaas Bernardus Roozen, Eindhoven (NL)

(73) Assignee: Philips Electronics North America Corporation, New York, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/233,844

(22) Filed: Jan. 20, 1999

(51) Int. Cl.$^7$ .............................................. H05B 41/16
(52) U.S. Cl. .................. 315/248; 315/200 R; 315/291; 315/307; 315/55; 310/311; 310/314
(58) Field of Search ................................. 315/248, 246, 315/247, 200 R, 276, 291, 307, 55; 310/311, 314, 316.01, 319, 324, 348; 323/355, 358, 908; 363/52, 55, 125, 141, 123

(56) References Cited

U.S. PATENT DOCUMENTS

| 4,283,658 A | | 8/1981 | Parker .......................... 315/117 |
| 4,751,713 A | | 6/1988 | Affleck .......................... 372/59 |
| 4,910,439 A | * | 3/1990 | El-Hamamsy et al. ......... 315/248 |
| 5,008,582 A | | 4/1991 | Tanuma et al. .............. 310/332 |
| 5,243,261 A | * | 9/1993 | Bergervoet et al. ......... 315/248 |
| 5,381,950 A | | 1/1995 | Aldridge ...................... 236/1 R |
| 5,825,642 A | * | 10/1998 | Ishii et al. ................... 363/141 |
| 5,905,647 A | * | 5/1999 | Shirai .......................... 363/141 |
| 5,949,192 A | * | 9/1999 | Kominami et al. ........... 315/94 |
| 6,028,777 A | * | 2/2000 | Nguyen et al. .............. 363/37 |

FOREIGN PATENT DOCUMENTS

| GB | 2184302 A | 6/1987 | ........... H05B/41/16 |
| WO | WO9424437 | 10/1994 | ........... F04B/43/04 |

* cited by examiner

*Primary Examiner*—Don Wong
*Assistant Examiner*—Thuy Vinh Tran

(57) ABSTRACT

A lamp electronic ballast with a piezoelectric cooling fan. Use of ballast-driven lamps is limited in some lighting applications by thermal considerations. For example, the problem of heat removal from compact fluorescent lamps with integrated ballasts has limited their use. Similarly, the use of ballast-driven fluorescent lighting in high hat and other closed luminaire applications has been limited by thermal considerations. Thermal management of ballasts for such thermally sensitive applications is provided by a piezoelectric fan integrated with the ballast. The power to drive the fan may be obtained from the same AC line input that supplies the ballast, or from an AC ripple voltage present at the output of a rectifier in the ballast, or from the output of the ballast to the lamp, or from any suitable circuit location in the ballast. The fan maybe a membrane-type spot-cooler comprising a thin membrane carried by a frame mounted adjacent a hot spot. The membrane has one or more holes in it and is vibrated about a central plane by suitably spaced piezoelectric elements attached to the membrane.

32 Claims, 5 Drawing Sheets

LAMP ELECTRONIC BALLAST WITH A PIEZOELECTRIC COOLING FAN

BACKGROUND OF THE INVENTION

This invention relates generally to thermal management of electronic ballasts for fluorescent and other ballast-driven lamps, and more particularly to such thermal management using a piezoelectric fan, and to a piezoelectric fan especially suited to cooling electronic components and devices, including electronic ballasts.

Use of ballast-driven lamps is limited in some lighting applications by thermal considerations. For example, the problem of heat removal from compact fluorescent lamps with integrated ballasts, particularly those of higher wattage (e.g., 32 W and greater), has limited their use. Similarly, the use of ballast-driven fluorescent lighting in high hat and other closed luminaire applications has been limited by thermal considerations.

While the use of fans in cooling applications is, of course, relatively widespread, and different types of fans, including piezoelectric fans, are known for use in various cooling applications and other applications, to the inventors' knowledge, fans have not heretofore been integrated with electronic ballasts for lamps to cool the ballasts.

For example, U.S. Pat. No. 5,008,582 and Russian Patent No. 1,540,050 disclose the use of a piezoelectric fan for cooling a semiconductor chip or a microelectronic device, and U.S. Pat. Nos. 5,381,950 and 4,751,713 disclose the use of piezoelectric fans for other applications. International Publication No. WO 94/24437 discloses a piezoelectric pump. U.S. Pat. No. 4,283,658 discloses the use of a blower to cool a projection lamp. UK patent publication GB 2184302A discloses the use of a fan motor winding of a cooker or refrigerator as ballast for a fluorescent lamp within the cooker or refrigerator.

None of the patents identified above addresses the problem of heat management in ballast-driven lighting applications, and none discloses the use of a fan to cool an electronic ballast for a lamp. Although piezoelectric fans are known for cooling electronic components, as disclosed in the patents discussed above, there is a need for a compact and efficient piezoelectric fan for removing heat from small hot spots in, on or adjacent electronic components.

SUMMARY OF THE INVENTION

It is an object of the invention to thermally manage electronic ballasts for lamps.

It is another object of the invention to actively remove heat from electronic ballasts.

It is another object of the invention to provide a piezoelectric fan for localized or spot cooling at high efficiency.

It is another object of the invention to provide a compact piezoelectric fan having a low profile.

The invention disclosed herein addresses limitations on the use of ballast-driven lamps in thermally-sensitive applications, and achieves certain of the objects described above by actively removing heat from an electronic ballast, generally, or from one or more selected critical components therein. Such active heat removal from electronic ballasts is implemented in accordance with the invention by a fan.

In a preferred embodiment, the fan is a piezoelectric fan integrated with the ballast, for example, mounted to the ballast housing or to a printed circuit board within the housing, or to a component within the housing. Piezoelectric fans are well known in the art and essentially are solid state devices which do not require a driving motor. According to the invention, the piezoelectric cooling fan is coupled to the ballast to receive driving power therefrom. The ballast may be conventional and may include an AC to DC converter and an inverter, as well as other elements such as a power factor correction circuit and a DC to DC converter coupled between the AC to DC converter and the inverter for control purposes. The mechanical resonance of the fan and the frequency of the power coupled thereto from the ballast are related, e.g., the frequencies may be the same or they may be harmonically related.

In one embodiment, the piezoelectric fan is coupled to be driven from the AC line input to the ballast. In another embodiment, the AC to DC converter (e.g., a rectifier) in the ballast provides a DC voltage with an AC ripple voltage which (the AC ripple voltage) is coupled to drive the piezoelectric fan. In other embodiments, the inverter provides an AC voltage which is coupled to drive a lamp and to drive the piezoelectric fan. The driving power for the fan may be coupled from any other suitable point in the ballast. With suitable power coupling from the ballast, a separate control circuit for the fan is not needed, and the use of a piezoelectric fan eliminates the need for a fan motor.

A suitable conversion circuit converts the power coupled from the ballast circuit (e.g., from the AC line voltage, or the AC ripple voltage, or the AC lamp driving voltage) to one suitable to drive the piezoelectric fan.

The invention also addresses the need for a compact fan for removing heat from small areas and hot spots in, on or adjacent electronic components, and provides a piezoelectric fan which satisfies this need and achieves certain of the objects described above. A piezoelectric fan according to the invention, rather than operating by cantilever action to create an air flow, includes a membrane vibrated about a central plane by one or more suitably positioned piezoelectric elements to create an air flow through one or more apertures in the membrane.

The membrane is mounted directly to the component, or on or adjacent the localized area to be cooled, e.g., on or adjacent a hot spot. The piezoelectric element or elements, which flex when an appropriate electrical signal is applied thereto, are mounted to the membrane to vibrate it about the central plane. The membrane is fixed about its periphery to a frame, for example, and the piezoelectric element or elements are configured and fixed to the membrane at one end thereof to undergo relatively large out-of-plane bending movements at the free end thereof so as to vibrate the membrane normal to its plane. Such vibrations of the membrane cause air to be moved through a hole or holes in the membrane alternately in opposite directions. The moving air thus comes into direct contact with the hot spot adjacent the membrane to cool the hot spot.

Because the membrane vibrates about a central plane, the piezoelectric fan may be made compact and have a low profile, which makes it especially suited to removing heat from small hot spots in electronic circuitry or components.

In a preferred embodiment, four piezoelectric elements are positioned about the periphery of the membrane spaced 90 E apart, and the membrane is provided with a central aperture through which the air is moved. The membrane may be made of a polyamide material and the piezoelectric elements may be bimorphous ceramic elements.

The invention improves the state of the art by enabling air movement only near those components that need cooling. Thus, management of air movement is improved, which leads to more efficient heat removal. Moreover, the membrane, spot-type piezoelectric fan provided by the invention can be mounted directly to an electronic component as an integral part thereof. Thus, air impinges directly on the surface of the component, leading to very efficient heat removal. As mentioned, another advantage is the very low profile of the fan which is needed in miniaturized circuits.

BRIEF DESCRIPTION OF THE DRAWINGS

The invention is illustrated in the figures of the accompanying drawings which are meant to be exemplary and not limiting, in which like numerals in the different figures refer to like or corresponding parts, and in which.

DESCRIPTION OF THE PREFERRED EMBODIMENTS

Figure 1:
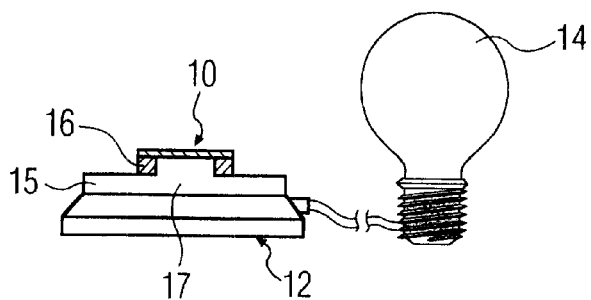
FIG. 1 is a schematic, partially cross-sectional diagram of a piezoelectric fan integrated with an electronic ballast in accordance with the invention.

FIG. 1 represents in schematic form integration of a piezoelectric fan 10 with an electronic ballast 12 for a lamp 14. For example, the piezoelectric fan 10 may be mounted to a housing 15 of the ballast by a frame 16 which resembles a picture frame. The frame 16 may be attached to the housing 15 by an adhesive or a clip, or in any suitable manner. The fan 10 is in communication with the interior of the housing through an aperture 17 to establish air flow between the interior and exterior of the housing to cool the interior of the housing. Alternatively, the piezoelectric fan can be mounted to a printed circuit board or electronic component within the housing which has a vent to permit air flow into and out of the housing. The piezoelectric fan can also be mounted to the housing to establish an air flow along a surface thereof to remove heat generally therefrom. Piezoelectric fans are well known in the art, and further details for mounting a piezoelectric fan to an electronic ballast will be known to one of ordinary skill in the ballast and electronic arts from the disclosure herein. Similarly, details regarding fan size and air flow are known and need not be described herein. In addition, a specific embodiment of a piezoelectric fan is described below.

Figure 2:
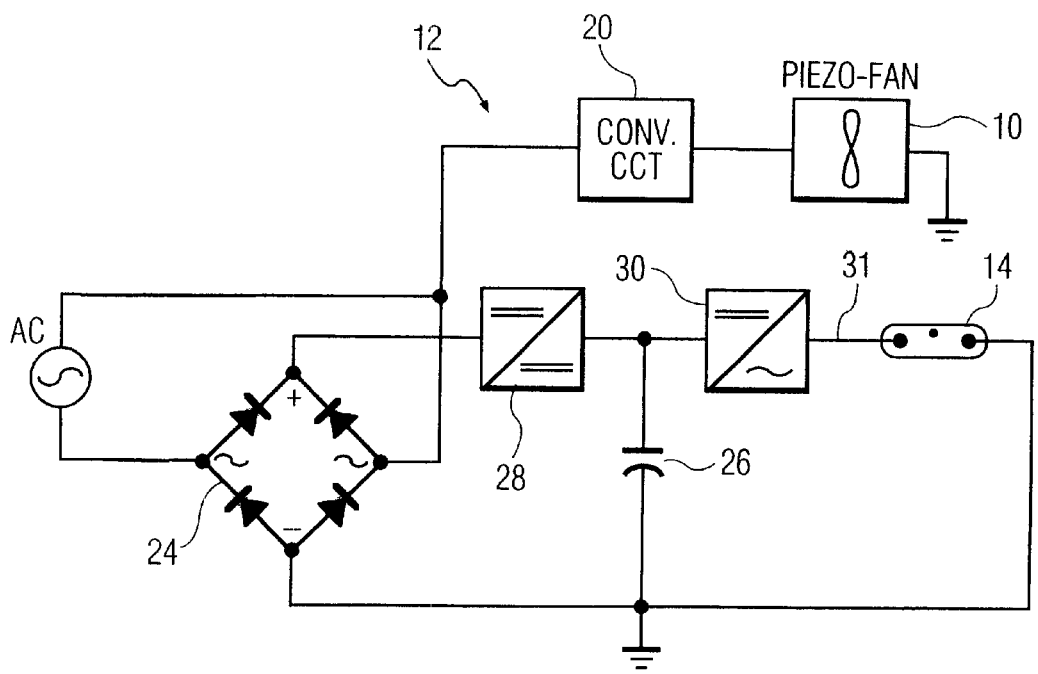
FIGS. 2–5 are schematic circuit diagrams of embodiments of the invention illustrating an electronic ballast and coupling of power from the electronic ballast to the piezoelectric fan.

The electronic ballast 12 represented in FIG. 2 receives an AC power line input and provides an AC output at 31 to drive the lamp 14. In this embodiment, the piezoelectric fan 10 is coupled to the AC line via a conversion circuit 20 which receives the AC line voltage (e.g., 115 volts, 60 Hz.) and converts it to a voltage suitable to drive the piezoelectric fan 10 (e.g., 30–60 volts, 120 Hz.). The conversion circuit 20 may include a transformer or other step-down device or circuitry for reducing the AC voltage to about 30 volts to about 60 volts AC. The piezoelectric fan 10 is selected to operate, i.e., have mechanical resonance, at the frequency of the AC line (e.g., 60 Hz.), or a harmonic thereof. The electronic ballast 12 includes a bridge full wave rectifier 24 (an AC to DC converter), a filter capacitor 26 coupled thereto via a power factor correction circuit 28, and an inverter 30. The inverter 30 is coupled to the lamp 14 and provides at its output 31 an AC voltage at a given resonant frequency to drive the lamp, e.g. in the tens of KHz.

Figure 3:
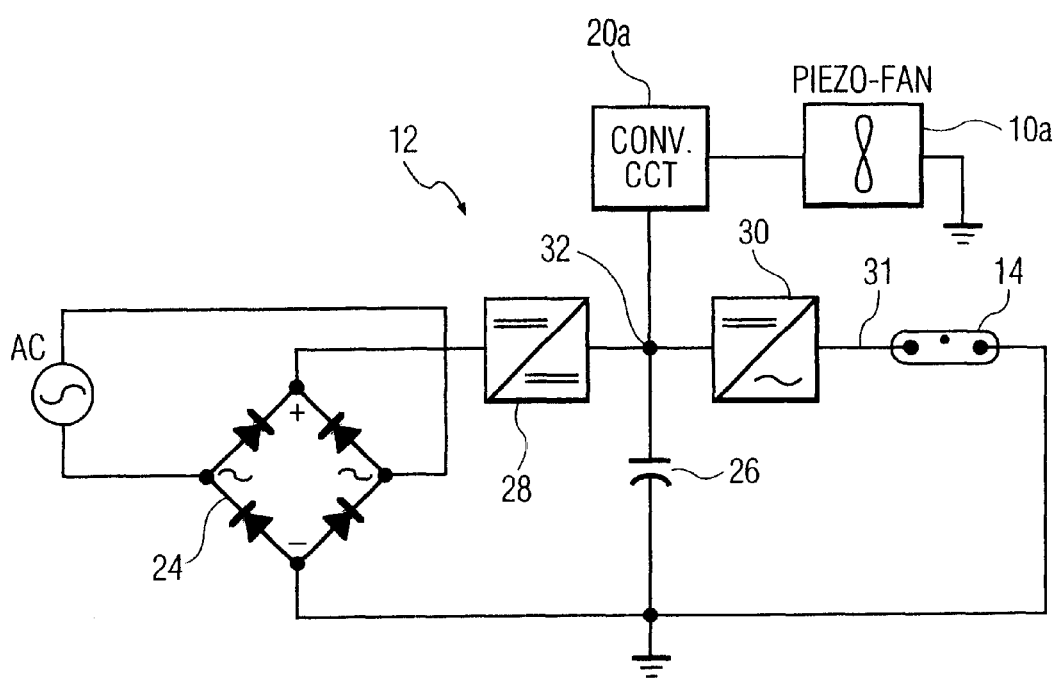

In the embodiment represented in FIG. 3, the electronic ballast 12 includes the same components as ballast 12 in FIG. 2. In this embodiment, the piezoelectric fan 10a is coupled to the DC output 32 of the rectifier 24 (across the filter capacitor 26), which has an AC ripple component, via a conversion circuit 20a and the power factor correction circuit 28. The conversion circuit 20a provides an AC voltage of about 30–60 volts at twice the AC line frequency (e.g. 120 Hz.) to the piezoelectric fan 10a, which is selected to have mechanical resonance at the ripple voltage frequency, or a harmonic thereof.

Figure 4:
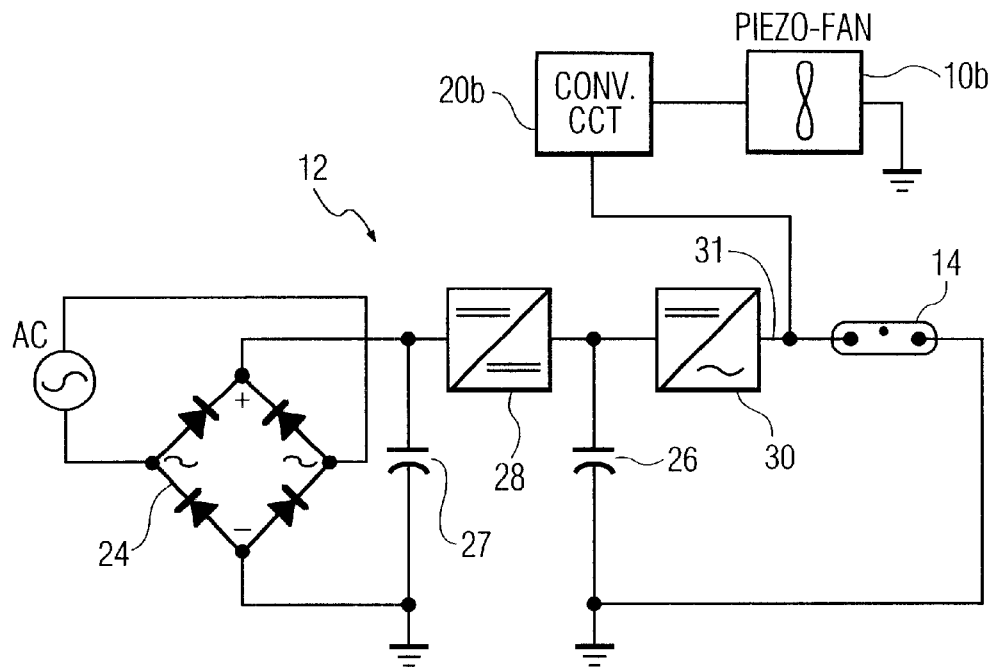

In the embodiment represented in FIG. 4, the ballast 12 includes the rectifier 24, the filter capacitor 26, the power factor correction circuit 28 and the inverter 30 as in the ballast 12 represented in FIGS. 2 and 3, and an additional filter capacitor 27. The conversion circuit 20b is coupled in this embodiment to the output 31 of the inverter 30, which is also connected to the lamp 14, and the inverter output 31 provides the AC voltage at a given resonant frequency to the conversion circuit 20b. The piezoelectric fan 10b is selected to have a mechanical resonance at the resonant frequency of the voltage output by the inverter 30.

Figure 5:
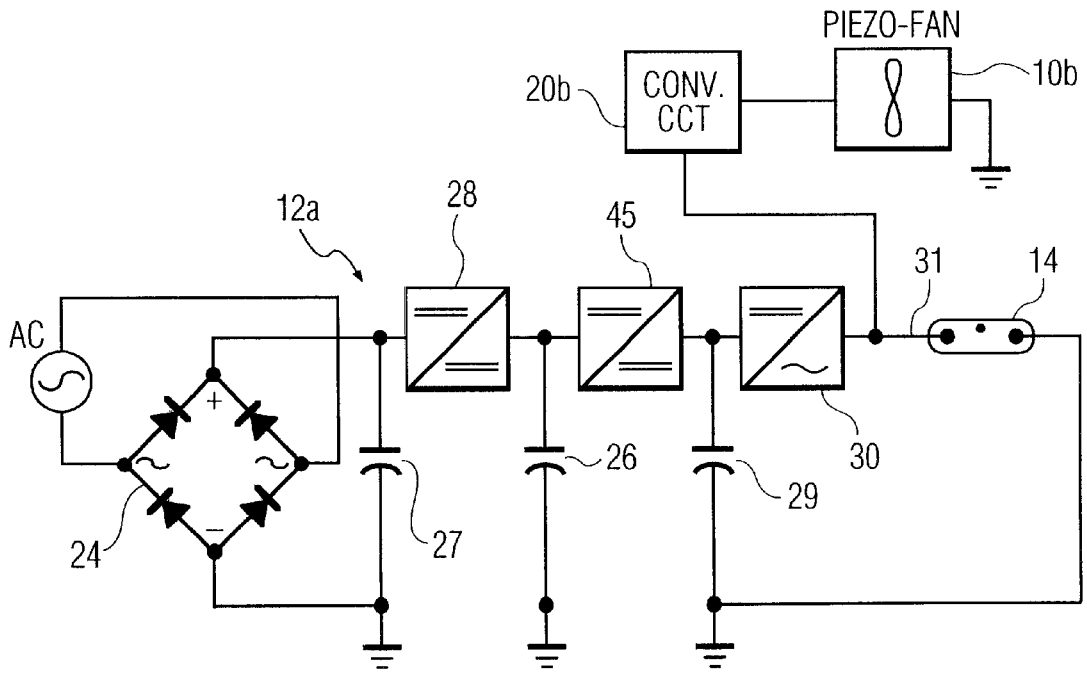

The ballast 12a in FIG. 5 is the same as the ballast 12 in FIG. 4, except that ballast 12a includes a DC to DC converter 45 coupled between the optional power factor correction circuit 28 and the inverter 30 and an additional filter capacitor 29. The DC to DC converter 45 controls power delivered to the lamp 14 and allows adjustment of the given resonant frequency of the power supplied to the lamp 14. The conversion circuit 20b for ballast 12a and the fan 10b in FIG. 5 are the same as for ballast 12 in FIG. 4.

In all embodiments, the power factor correction circuit 28 is optional and may be omitted. The power factor correction circuit 28, the inverter 30 and the DC to DC converter 45 may all be conventional.

Figure 6:
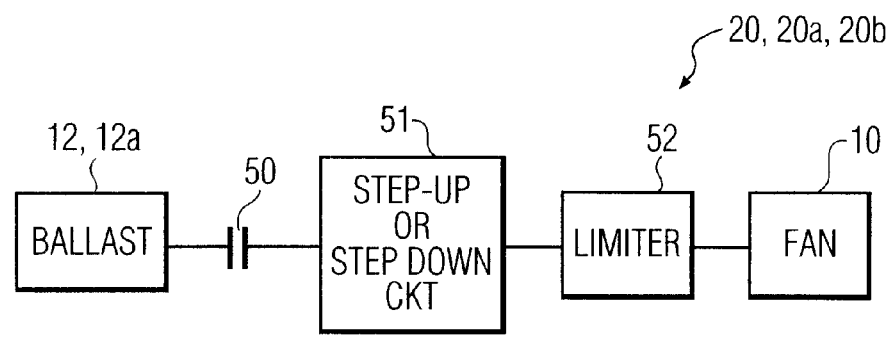
FIG. 6 is a block diagram of a conversion circuit coupling power from the ballast to the fan in the embodiments of FIGS. 2–5.
Figure 7:
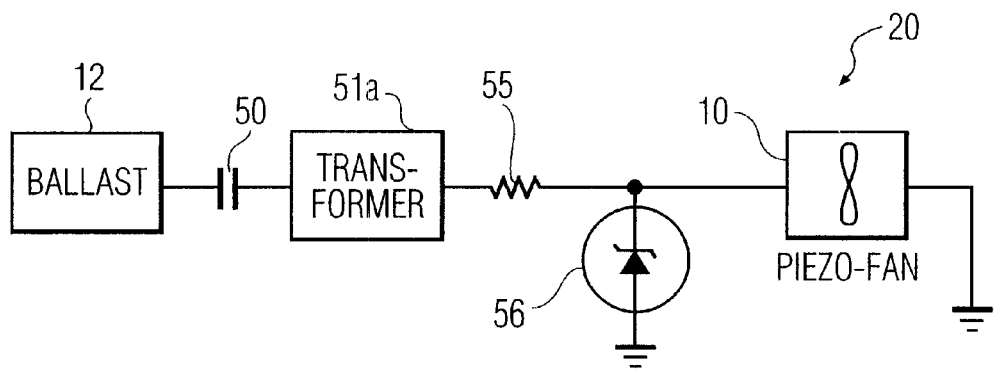
FIG. 7 is a schematic circuit diagram of one conversion circuit.
Figure 8:
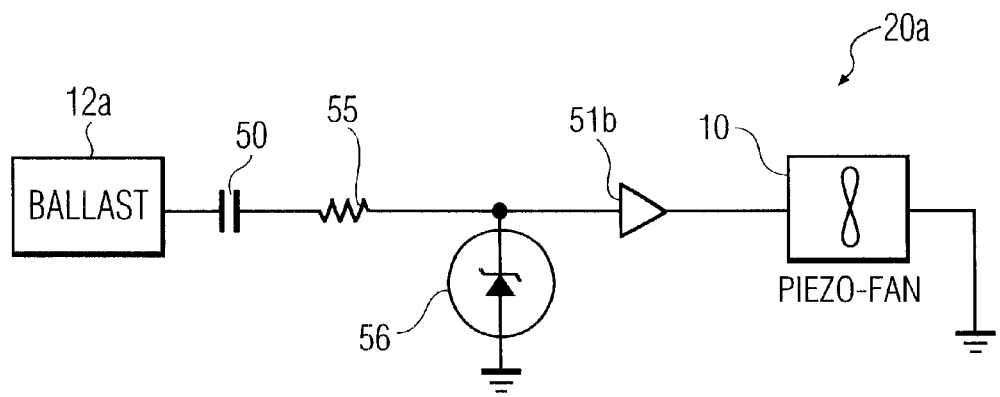
FIG. 8 is a schematic circuit diagram of another conversion circuit.

FIG. 6 depicts a block diagram of a conversion circuit 20, 20a, 20b, which includes an AC coupling capacitor 50, a step-up or step-down circuit 51, and a current and/or voltage limiter 52. FIG. 7 depicts an embodiment of conversion circuit 20, which includes an AC step-down transformer 51a, a current limiting resistor 55, and a voltage—limiting zener diode 56. The conversion circuit 20a depicted in FIG. 8 includes an amplifier 51b (or step-up transformer) instead of a step-down transformer. Conversion circuit 20b is similar to conversion circuit 20a.

Figure 9:
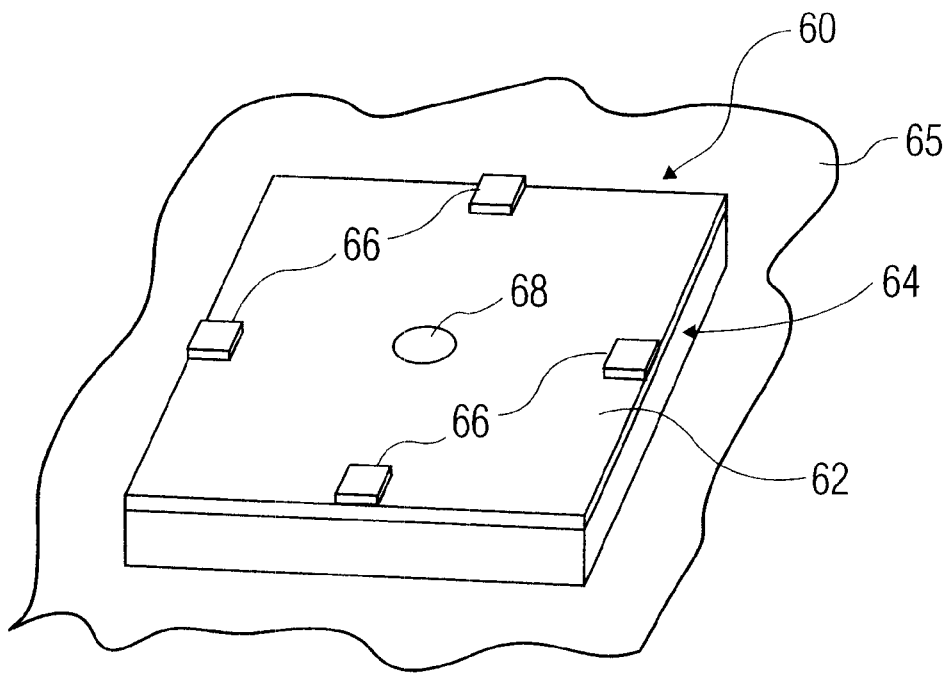
FIG. 9 is an illustration of a piezoelectric fan constructed in accordance with the invention mounted to a surface of an electronic component or device.

Referring to FIG. 9, a piezoelectric fan 60 constructed in accordance with the invention comprises a thin membrane 62 (e.g., made of a polyamide material) mounted to a frame 64 fixed to a surface 65 of an electronic component or device. The membrane 62 is clamped at its edges to a frame 64 by an adhesive, or in any other suitable manner. The frame 64 resembles a picture frame in configuration and shape, as pointed out above. The shape and size of the frame and the membrane can be such as to suit the configuration and size of the spot or component to be cooled. Four piezoelectric bimorphous ceramic elements 66 are adhered by an adhesive, or in another suitable manner, to the membrane 62 spaced 90 degrees apart. One end of each piezoelectric element 62 is fixed by attachment to the frame 64 by an adhesive or in any suitable manner. Flexing of the part of the piezoelectric elements attached to the membrane vibrate the membrane. The frame may be mounted directly to the component by an adhesive or a mechanical clip, similar to the manner in which heat sinks are mounted to electronic components.

The membrane 62 has a small hole 68 in the center thereof, but more than one hole may be provided in suitable locations. Electrical contacts for driving the piezoelectric elements 66 can be made by copper traces integral with the membrane 62. Copper-polyamide sheets widely used in circuit applications and known in the art may be used here. Excitation of the piezoelectric elements 66 by an AC signal causes them to undergo large out-of-plane bending movements at the end attached to the membrane, causing the membrane 62 to vibrate normal to its plane. This causes air to be sucked in and pushed out alternately through the central hole 68 in the membrane. When mounted on a hot component, the piezoelectric fan 60 causes the moving air to impinge directly on the surface of the component to cool it.

Figure 10:
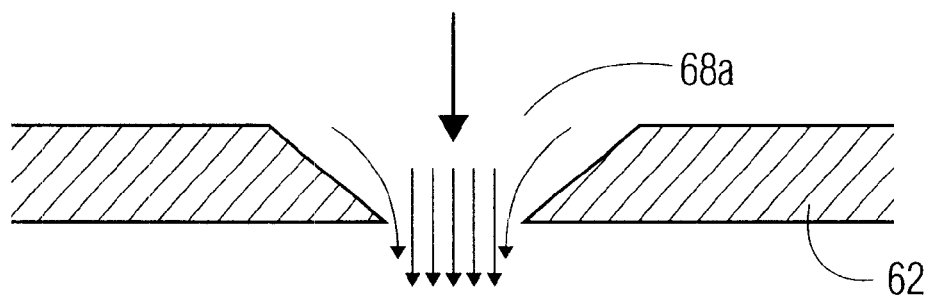
FIG. 10 is an enlarged view in cross section of a portion of a membrane for the fan depicted in FIG. 9 with a hole therethrough having a geometry different from the one shown in FIG. 9.

The geometry of the hole 68 through the membrane 62 can affect air movement through the membrane, and can be configured to improve air movement in at least one direction, particularly through thicker membranes. For example, the cross section of the hole 68 may be non-symmetrical and/or otherwise non-uniform over the thickness of the membrane. FIG. 10 shows a hole 68a with a non-symmetrical hole that improves air movement unidirectionally in the direction of the arrow. The hole 68a uniformly decreases in diameter from one side of the membrane 62 to the other, with air movement being improved in the direction of decreasing hole diameter. With the disclosure herein, one of skill in the art can design other hole geometries that improve air movement through the fan's membrane 62.

The membrane 62 can be forced to vibrate at its mechanical resonant frequency thereby maximizing its vibration amplitude and hence the air flow rate. The thickness and material of the membrane 62 may be selected such that its mechanical resonant frequency equals the frequency of a signal (or a harmonic thereof) already available in the circuit to be cooled, for example, the output ripple voltage in a lamp driver, as described above.

The performance of the piezoelectric fan 60 can be improved significantly by utilizing both the structural resonance of the membrane and the acoustic resonance of the system. This acoustic resonance, which is termed Helmholtz resonance in the technical literature, comprises an amount of air which moves through the membrane hole 68 acting as a mass, and the air volume in a cavity below the membrane 62, which forms the compliance or stiffness of the system. The Helmholtz resonance squared is among others inversely proportional to the volume of the cavity below the membrane, and proportional to the cross-sectional area of the hole in the membrane. In practice, at the Helmholtz frequency the air in the hole of the membrane comes into resonance. The piezoelectric fan 60 may then have a combined mechanical membrane resonance and acoustic Helmholtz resonance of the acoustic cavity below the membrane related to the frequency of the AC driving signal, e.g., equal to the AC frequency or a harmonic thereof.

Letting the structural resonance of the membrane and the acoustic Helmholtz resonance of the system coincide at a single frequency while driving the system at this frequency, improves significantly the performance of the piezoelectric fan in accordance with the invention.

A key advantage of piezoelectric fan 60 is that it can be mounted directly on the component to be cooled to maximize the cooling effect of the moving air relative to the hot component. This can also be achieved by a conventional motor-driven fan or a conventional piezoelectric fan, but the inventive piezoelectric fan 60 has the advantages of lower profile, flexibility of shape and size, and better efficiency.

While the invention has been described and illustrated in connection with preferred embodiments, many variations and modifications, as will be apparent to those of skill in the art, may be made without departing from the spirit and scope of the invention. For example, the fan may be mounted in different ways, and operated at different voltages and frequencies. Also, various embodiments of conversion circuits may be used depending upon the particular power coupled to drive the fan and the particular piezoelectric fan. The invention as set forth in the appended claims is thus not limited to the precise details of construction set forth above as such variations and modifications are intended to be included within the spirit and scope of the invention as set forth in the defined claims.

What is claimed is:

1. The combination of a lamp electronic ballast and a piezoelectric fan positioned to remove heat from the ballast, the ballast comprising a rectifier adapted to receive AC power and produce DC power with an AC ripple voltage, and an inverter coupled to the rectifier and to an output of the ballast which is adapted to be coupled to a lamp, the piezoelectric fan being coupled to be driven by power from said AC ripple voltage present at the rectifier and having a mechanical resonance related to the frequency of the AC ripple voltage.

2. The combination as claimed in claim 1 wherein the ballast comprises a power factor correction circuit coupled between the rectifier and the inverter.

3. The combination as claimed in claim 1 comprising a conversion circuit for the piezoelectric fan coupled to receive the AC ripple voltage and provide power suitable for driving the piezoelectric fan.

4. The combination as claimed in claim 1 wherein the piezoelectric fan comprises a membrane having one or more apertures therein, and one or more piezoelectric elements fixed so as to vibrate the membrane about a central plane in response to the power coupled from the ballast effective to move air through the one or more apertures.

5. The combination as claimed in claim 4 wherein the piezoelectric fan comprises four piezoelectric elements fixed to and spaced 90E apart about the periphery of the membrane, the membrane having a central aperture, and wherein a frame is mounted adjacent the area to be cooled and the membrane and one end of the piezoelectric elements are fixed to the frame.

6. The combination as claimed in claim 5 wherein the membrane is made of a polyamide material and the piezoelectric elements are bimorphous ceramic elements.

7. The combination as claimed in claim 4 wherein the membrane has a hole therethrough of non-uniform cross section configured to improve air movement therethrough in at least one direction.

8. The combination as claimed in claim 7 where the hole of non-uniform cross section decreases in cross-sectional area in a direction in which improved air movement is desired.

9. The combination as claimed in claim 4 wherein the mechanical resonance of the piezoelectric fan is the combined mechanical resonance of the membrane and the acoustic Helmholtz resonance of an acoustical cavity below the membrane.

10. The combination of a lamp electronic ballast and a piezoelectric fan positioned to remove heat from the ballast, the ballast providing AC power at an output thereof which is adapted to be coupled to a lamp and comprising an inverter coupled to receive DC power and to provide the AC power at an output thereof, the piezoelectric fan being coupled to the output of the inverter and having a mechanical resonance related to the frequency of the AC power.

11. The combination as claimed in claim 10 comprising an AC to DC converter coupled to receive AC power and provide the DC power to the inverter.

12. The combination as claimed in claim 11 wherein the ballast output is coupled to the output of the inverter.

13. The combination as claimed in claim 12 wherein the ballast comprises a power factor correction circuit coupled between the AC to DC converter and the inverter.

14. The combination as claimed in claim 12 wherein the ballast comprises a DC to DC converter coupled between the AC to DC converter and the inverter.

15. The combination as claimed in claim 10 comprising a conversion circuit for the piezoelectric fan coupled to receive the AC power at the output of the inverter and provide power suitable for driving the piezoelectric fan.

16. The combination as claimed in claim 10 wherein the piezoelectric fan comprises a membrane having one or more apertures therein, and one or more piezoelectric elements fixed so as to vibrate the membrane about a central plane in response to the power coupled from the ballast effective to move air through the one or more apertures.

17. The combination as claimed in claim 16 wherein the piezoelectric fan comprises four piezoelectric elements fixed to and spaced 90 E apart about the periphery of the membrane, the membrane having a central aperture, and wherein a frame is mounted adjacent the area to be cooled and the membrane and one end of the piezoelectric elements are fixed to the frame.

18. The combination as claimed in claim 17 wherein the membrane is made of a polyamide material and the piezoelectric elements are bimorphous ceramic elements.

19. The combination as claimed in claim 16 wherein the mechanical resonance of the piezoelectric fan is the combined mechanical resonance of the membrane and the acoustic Helmholtz resonance of an acoustical cavity below the membrane.

20. A miniature piezoelectric fan comprising a membrane having one or more apertures therein, and one or more piezoelectric elements fixed so as to vibrate the membrane about a central plane in response to an electrical signal coupled to the piezoelectric elements effective to move air through the one or more apertures.

21. The piezoelectric fan as claimed in claim 20 comprising four piezoelectric elements fixed to and spaced 90 E apart about the periphery of the membrane, the membrane having a central aperture, and wherein a frame is mounted adjacent the area to be cooled and the membrane and one end of the piezoelectric elements are fixed to the frame.

22. The piezoelectric fan as claimed in claim 21 wherein the membrane is made of a polyamide material and the piezoelectric elements are bimorphous ceramic elements.

23. The piezoelectric fan as claimed in claim 22 wherein the membrane has a hole therethrough of non-uniform cross section configured to improve air movement therethrough in at least one direction.

24. The piezoelectric fan as claimed in claim 23 where the hole of non-uniform cross section decreases in cross-sectional area in a direction in which improved air movement is desired.

25. The piezoelectric fan as claimed in claim 20 wherein the membrane has a mechanical resonance, and the piezoelectric fan can be driven by an electrical signal having a frequency related to the mechanical resonance of the membrane.

26. The piezoelectric fan as claimed in claim 20 wherein the membrane has a mechanical resonance, and the piezoelectric fan can be driven by an electrical signal having a frequency related to the combined mechanical resonance of the membrane and the acoustic Helmholtz resonance of an acoustical cavity below the membrane.

27. The combination of a lamp electronic ballast and a piezoelectric fan positioned to remove heat from the ballast, the ballast having an input for receiving electric power, and first means for producing power within the ballast for a ballast use other than cooling, said power within the ballast including a component at a frequency higher than the received electric power, said first means including second means for providing, from said power within the ballast including said component, electrical power at an output thereof which is adapted to be coupled to a lamp, the piezoelectric fan being electrically coupled to the ballast and for driving by power coupled from said component at a frequency higher than the received electric power.

28. The combination as claimed in claim 27 wherein said second means comprises an inverter which provides a high frequency AC voltage, said high frequency AC voltage being said component, the fan having a mechanical resonance related to said high frequency and being coupled to the ballast to be driven by the high frequency AC voltage provided by the inverter.

29. The combination as claimed in claim 28 wherein said second means provides the high frequency AC voltage at said output.

30. The combination as claimed in claim 28, further comprising a conversion circuit for the piezoelectric fan coupled to receive the AC voltage from the inverter and provide power suitable for driving the piezoelectric fan.

31. The combination as claimed in claim 27 wherein:

the received electric power is an AC voltage at a first frequency, said first means for producing power comprises a rectifier circuit converting said AC voltage at a first frequency to a DC voltage having an AC ripple voltage, the AC ripple voltage including said component at a frequency higher than the received electric power, said second means receives said DC voltage for providing the output, and the fan is coupled to be driven by said component of the AC ripple voltage and has a mechanical resonance related to the frequency of said component.

32. The combination as claimed in claim 31, further comprising a conversion circuit for the piezoelectric fan coupled to receive said component of the AC ripple voltage and provide power suitable for driving the piezoelectric fan.

* * * * *